United States Patent [19]

Nishizawa et al.

[11] Patent Number: 5,475,242

[45] Date of Patent: Dec. 12, 1995

[54] NOTCHED INSULATION GATE STATIC INDUCTION TRANSISTOR INTEGRATED CIRCUIT

[75] Inventors: Jun-ichi Nishizawa; Nobuo Takeda; Toshiyuki Kishine, all of Sendai, Japan

[73] Assignee: Small Power Communication Systems Research Laboratories Co., Ltd., Sendai, Japan

[21] Appl. No.: 425,250

[22] Filed: Apr. 17, 1995

Related U.S. Application Data

[63] Continuation of Ser. No. 183,246, Jan. 19, 1994, abandoned, which is a continuation-in-part of Ser. No. 947,806, Sep. 21, 1992, abandoned.

[30] Foreign Application Priority Data

Sep. 24, 1991 [JP] Japan ..................... 3-243139

[51] Int. Cl.$^6$ ................. H01L 29/78; H01L 21/330
[52] U.S. Cl. ................ 257/136; 257/155; 257/158; 257/205; 257/392; 257/598; 257/369
[58] Field of Search ................. 257/136, 135, 257/334, 332, 330, 369, 392, 42, 598, 158, 155, 205, 206, 348, 392

[56] References Cited

U.S. PATENT DOCUMENTS 4,243,997  1/1981  Natori et al. ............. 257/330
4,740,714  4/1988  Masaki et al. ............ 257/392
5,060,029  10/1991 Nishizawa et al. ......... 257/330

FOREIGN PATENT DOCUMENTS 4006299  8/1990  Germany ................ 257/136
0134960  10/1980  Japan .................. 257/136
0284846  11/1988  Japan .................. 257/136

Primary Examiner—Rolf Hille
Assistant Examiner—Alexander Oscar Williams
Attorney, Agent, or Firm—Oblon, Spivak, McClelland, Maier & Neustadt

[57] ABSTRACT

A notched insulation gate static induction transistor integrated circuit according to the present invention comprises an enhancement mode CMOS logic circuit including a notched insulation gate static induction transistor in which a threshold voltage is determined to prevent current from flowing in a standby mode, and a depletion enhancement mode CMOS logic circuit including a notched insulation gate static induction transistor in which a threshold voltage is determined to cause current to slightly flow in the standby mode. The enhancement mode CMOS logic circuit and the depletion enhancement mode CMOS logic circuit are formed on a major surface of a substrate, and the depletion enhancement mode CMOS logic circuit is used in a circuit in which an average power consumption in a switching operation is higher than that in the standby mode.

7 Claims, 5 Drawing Sheets

NOTCHED INSULATION GATE STATIC INDUCTION TRANSISTOR INTEGRATED CIRCUIT

This application is a Continuation of application Ser. No. 08/183,246, filed on Jan. 19, 1994, now abandoned, which is a Continuation-In-Part of application Ser. No. 07/947,806, filed on Sep. 21, 1992, now abandoned.

BACKGROUND OF THE INVENTION

1. Field of the Invention

The present invention relates to an integrated circuit capable of high-speed and low-power operation and, more particularly, to a CMOS integrated circuit using U-grooved insulated gate static induction transistors achievable of a high-speed and low-power operation even when a supplied voltage is small.

2. Description of the Related Art

A CMOS integrated circuit using conventional MOS transistors is generally used in a random logic, a memory, or the like and its greatest feature is low-power operation. In this conventional CMOS integrated circuit, stored charges in a load capacitor C correspond to energy loss within a transient state (0→1, 1→0 or H→L, L→H). Power dissipation P can thus be expressed by the following equation.

$$P = C \times V^2 \times f \quad \text{(V: Power supply voltage, f: Operation frequency)} \quad (1)$$

Since no current flows or no energy is dissipated in a steady state of the conventional CMOS integrated circuit, the circuit is characterized by low-power operation in view of its principle.

However, a conventional MOS transistor used for a CMOS integrated circuit is so designed as to use the vicinity of an interface between a semiconductor and an oxide film to move carriers. Therefore, the conventional MOS transistor has the drawback of poor drivability and low-speed operation.

The inventors of the present invention proposed a U-grooved insulated gate static induction transistor in, for example, Japanese Patent Application No. 52-1370, which eliminates the above drawback and has excellent characteristics as a high-speed switching device or a high-speed, low-power integrated circuits. Since this U-grooved insulated gate static induction transistor is so designed that the drain field effect reaches to the source, current flows in the substrate as well as in the interface between the semiconductor and insulation film. Therefore, the transistor has unsaturated current-voltage characteristics and high drivability. The transistor also has the advantage of decreasing a stray capacitance in view of its principle.

According to J. Nishizawa et al., "IEEE Transactions on Electron Devices," Vol. ED-37, No. 8, pp. 1877–1883 (1990), if a CMOS integrated circuit is formed using a U-grooved insulated gate static induction transistor on condition that a design rule is 1 μm and the depth of a U-shaped groove is 0.5 μm, the minimum switching time of 49 psec is obtained at a power dissipation of 7 mW.

In the CMOS integrated circuit of the U-grooved insulated gate static induction transistor, the power dissipation is determined by the same way as in the conventional CMOS integrated circuit, $C \times V^2 \times f$, it is effective in low-power operation to decrease the supplied voltage.

However, the decrease in the supplied voltage also reduces the drivability of the U-grooved insulated gate static induction transistor and prevents a high-speed operation thereof. So, high speed operation is incompatible with low voltage operation even if the U-grooved insulated gate static induction transistor is used.

SUMMARY OF THE INVENTION

It is accordingly an object of the present invention to provide a CMOS integrated circuit using U-grooved insulated gate static induction transistors capable of low-power and high-speed operation at a low supplied voltage.

A CMOS integrated circuit according to the present invention comprises an enhancement mode CMOS logic circuit including a U-grooved insulated gate static induction transistor in which a threshold voltage is determined to prevent current from flowing in a steady state, and a depletion mode CMOS logic circuit including a U-grooved insulated gate static induction transistor in which a threshold voltage is determined to cause current to slightly flow in the steady state. The enhancement mode CMOS logic circuit and said depletion mode CMOS logic circuit are formed on a major surface of a substrate, and the depletion mode CMOS logic circuit is used in a circuit in which an average power dissipation in a transient state is higher than that in the steady state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

Figure 1:
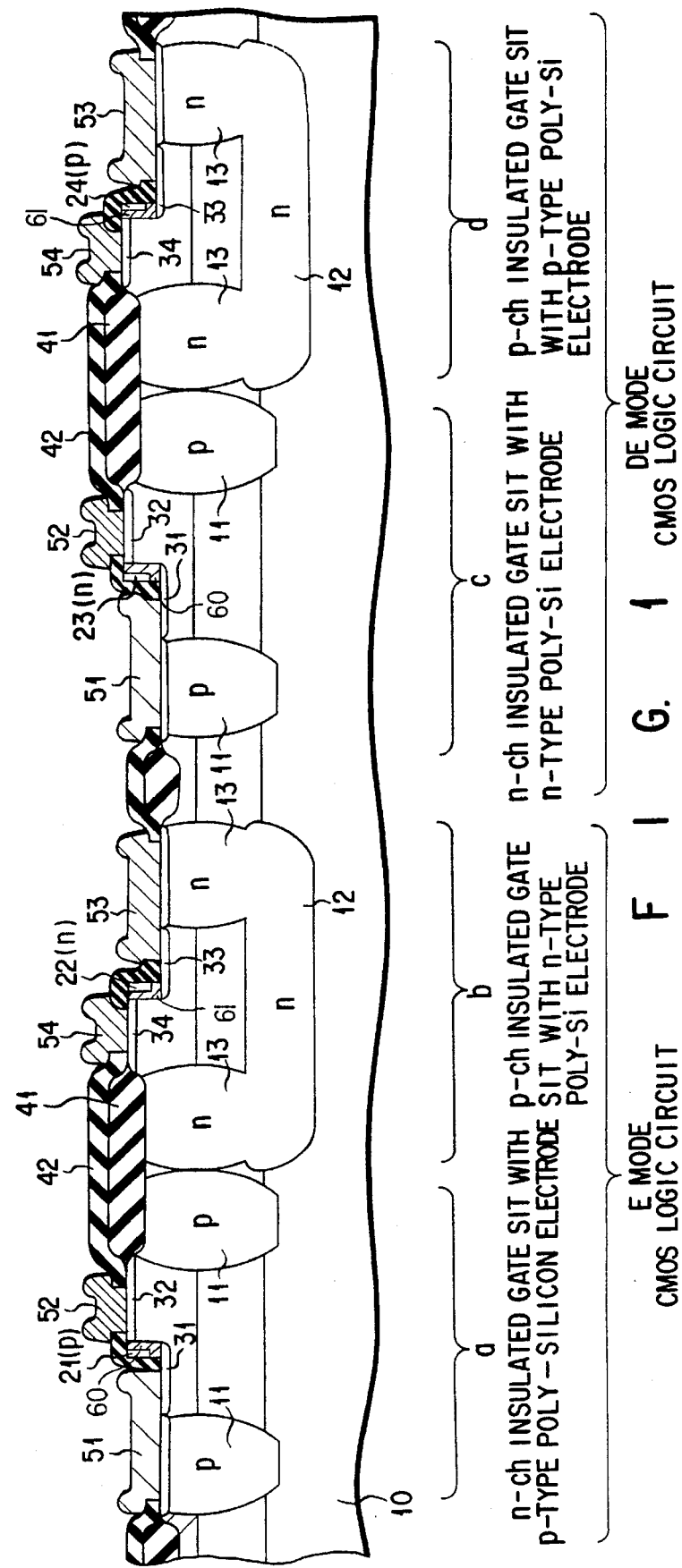
FIG. 1 is a cross-sectional view showing a constitution of a CMOS integrated circuit using a U-grooved insulated gate static induction transistor according to an embodiment of the present invention.

An embodiment of the present invention will be now described in detail, with reference to the accompanying drawings, FIG. 1 shows a cross sectional view of the U-grooved insulated gate static induction transistors (SITs) which constitute the CMOS integrated circuits according to the embodiment of the present invention, All of the U-grooved insulated gate SITs are formed on the high resistivity epitaxial layer on the major surface of the semiconductor substrate 10. U-shaped grooves are formed on the major surface of the semiconductor substrate. Thin gate oxide insulated gates 60, 61 and poly-silicon gate electrodes 21 to 24 are formed at the side walls of the grooves.

Each of the p-channel U-grooved insulated gate SITs is isolated by an n-type buried layer 12 and n-type channel stopper 13. Each of the n-channel U-grooved insulated gate SITs is isolated by a p-type channel stopper 11.

A source region 31, and a drain region 32 and an insulated gate 60 are formed in each of the n-channel insulated gate SITs, and a source region 33, and a drain region 34 and an insulated gate 61 are formed in each of the p-channel insulated gate SITs.

Furthermore, field oxide 41 and passivation oxide 42 are formed for device isolation and passivation. Metal wiring layers 51 to 54 are formed in their respective insulated gate SITs.

A gate electrode 21 of the p-channel insulated gate SIT (which is a region $\underline{a}$) is formed by a p-type poly-silicon and a gate electrode 22 of the n-channel insulated gate SIT (which is a region $\underline{b}$) is formed by n-type poly-silicon. In the case of these transistors, no drain current flows when a gate voltage equals zero. So, the CMOS circuit of this combination is called enhancement mode in which no power is dissipated in the steady state.

A gate electrode 23 of the n-channel insulated gate SIT (which is a region $\underline{c}$) is formed by a n-type poly-silicon and a gate electrode 24 of the p-channel insulated gate SIT (which is a region $\underline{d}$) is formed by p-type poly-silicon. In these transistors, a small amount of drain current flows when a gate voltage equals zero. So, the CMOS circuit of this combination is called depletion mode in which small power is dissipated in the steady state, but operates high speed.

Consequently, in the present invention, the depletion mode CMOS logic circuit is used where the power dissipation in the transient state is larger than that of steady state.

Figure 2:
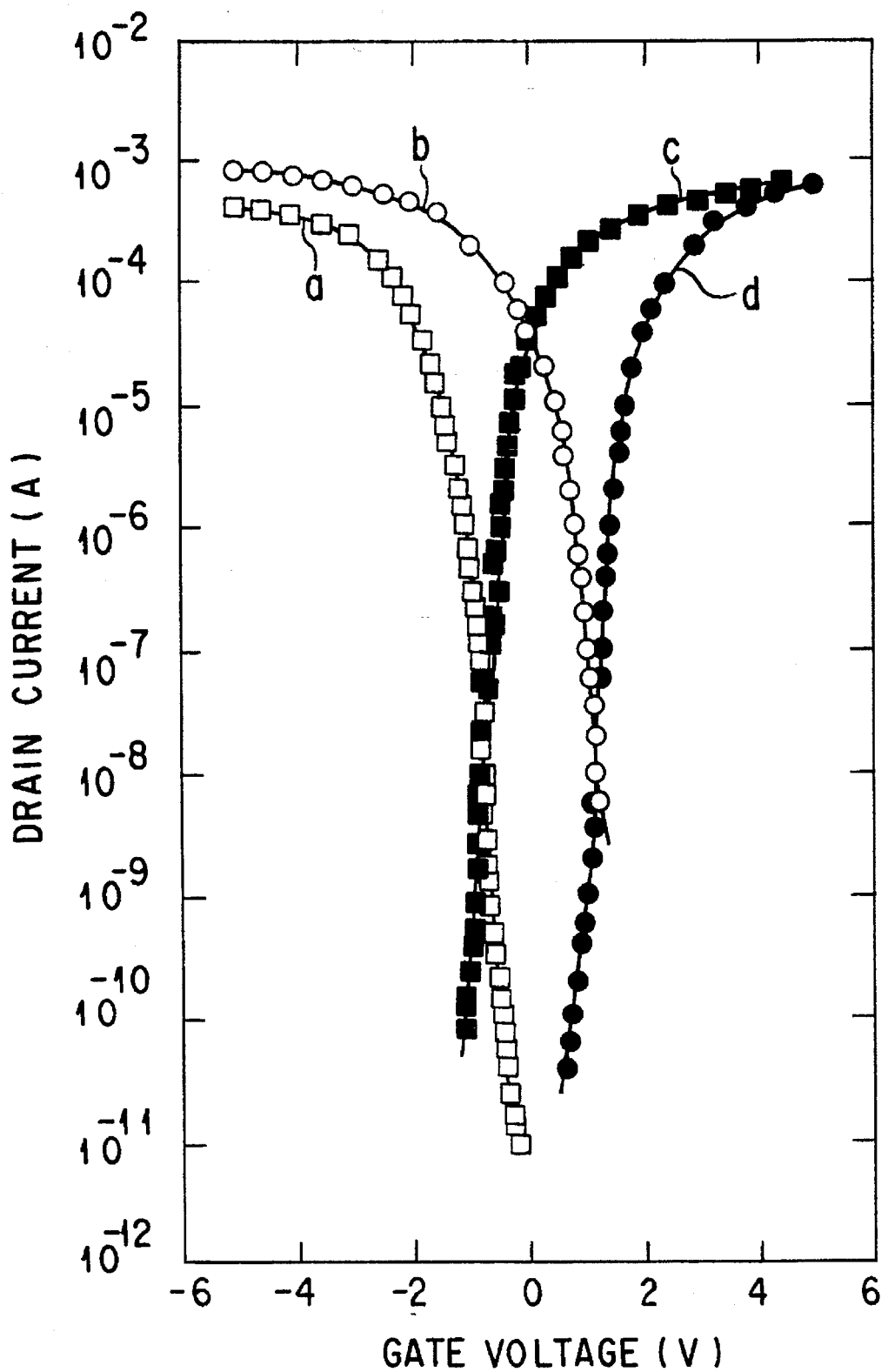
FIG. 2 is a graph showing a gate voltage—drain current characteristic of the U-grooved insulated gate static induction transistor in FIG. 1.

FIG. 2 shows a gate voltage—drain current characteristic of the U-grooved insulated gate static induction transistor according to the present invention. In FIG. 2, white plots $\underline{a}$ and $\underline{b}$ indicate the characteristics of p-channel MOS SITs and black plots $\underline{c}$ and $\underline{d}$ represent the characteristics of n-channel MOS SITs.

The plots $\underline{a}$ and $\underline{c}$ can be obtained if the gate electrodes are formed by n-type polysilicon of high impurity concentration, and the plots $\underline{b}$ and $\underline{d}$ can be obtained if they are formed by p-type polysilicon of high impurity concentration.

The CMOS logic circuit of the depletion mode is a combination of transistors having the characteristics represented by the plots $\underline{b}$ and $\underline{c}$. In these transistors, a drain current of about $2 \times 10^{-5}$ A flows when the gate voltage is 0. However, even though the supplied voltage is decreased to 1.5V, large drivability can be obtained because the current of about $5 \times 10^{-4}$ A can be caused to flow.

The CMOS logic circuit of the enhancement mode is a combination of transistors having the characteristics indicated by the plots $\underline{a}$ and $\underline{d}$. In these transistors, drain current hardly flows when the gate voltage is 0. However, when the supplied voltage is decreased to 1.5V, the current of only $10^{-5}$ or less can be caused to flow, so large drivability cannot be expected.

Figure 3:
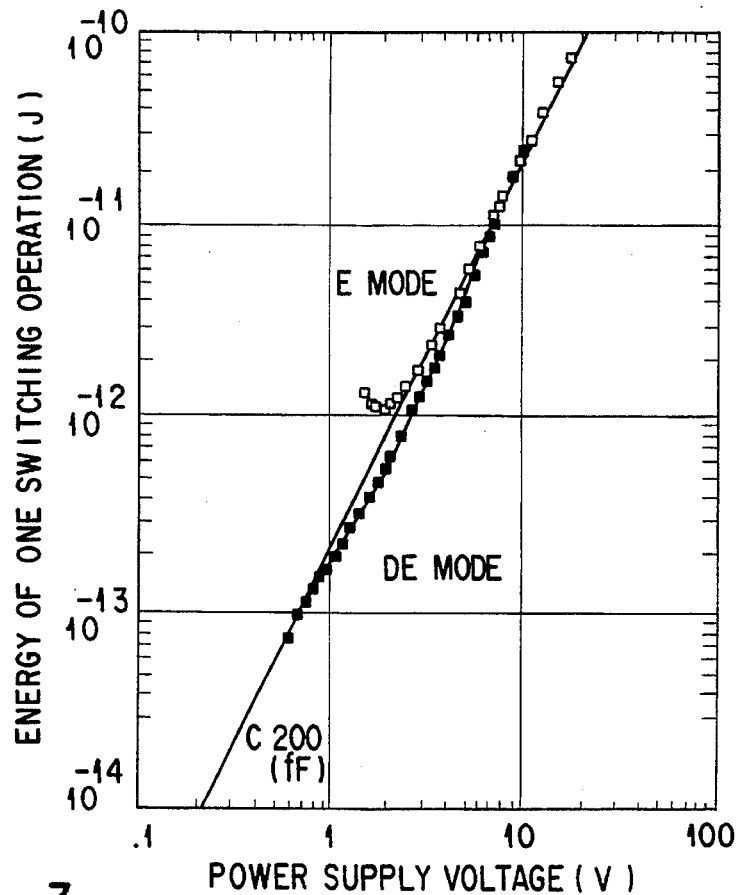
FIG. 3 is a graph showing a relationship between supplied voltage and energy loss in which a depletion mode CMOS logic circuit and an enhancement mode CMOS logic circuit are compared.

FIG. 3 shows a relationship between supplied voltage and energy loss in which the depletion mode CMOS logic circuit and the enhancement mode CMOS logic circuit are compared. Since the load capacitances of these CMOS logic circuits can be regarded as the same, there is no difference in the energy loss proportional to the square of the supplied voltage.

Figure 4:
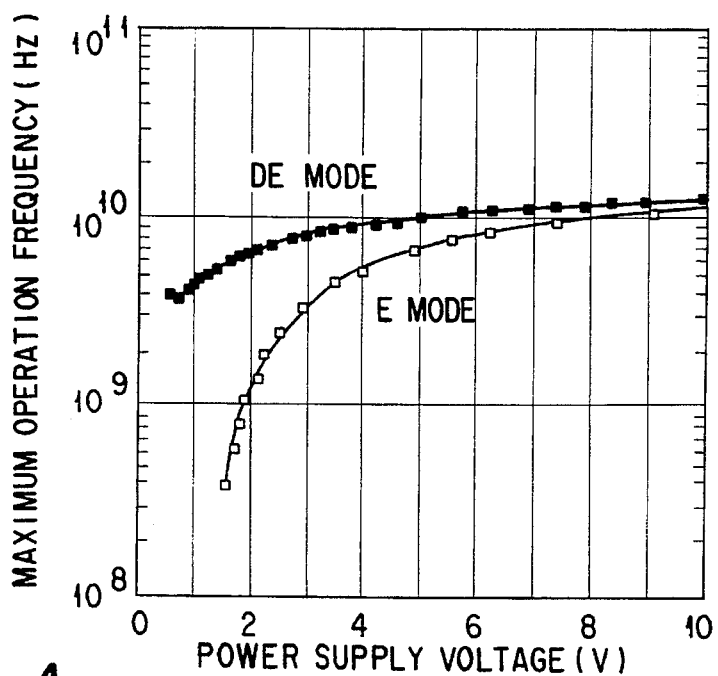
FIG. 4 is a graph showing a relationship between supplied voltage and the maximum operation frequency in which the depletion mode CMOS logic circuit and the enhancement mode CMOS logic circuit are compared.

FIG. 4 shows a relationship between supplied voltage and maximum operation frequency in which the depletion mode CMOS logic circuit and the enhancement CMOS logic circuit are compared. It is apparent from FIG. 2 that the maximum operation frequency of the depletion mode CMOS logic circuit is higher than that of the enhancement mode, CMOS logic circuit, especially when the power supply voltage is low. For example, when the supplied voltage is 1.5V, the enhancement mode CMOS logic circuit operates up to about 350 MHz. In comparison, the depletion CMOS logic circuit operates up to about 5.5 GHz.

Figure 5:
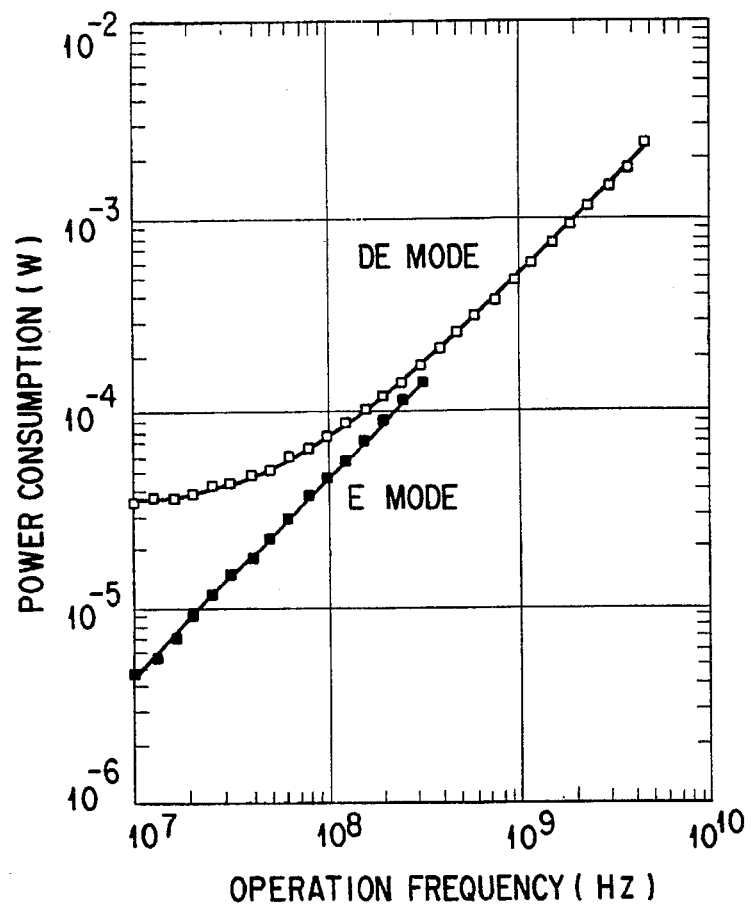
FIG. 5 is a graph showing a relationship between the operation frequency and power dissipation at the supplied voltage of 1.5V in which the depletion mode CMOS logic circuit and the enhancement mode CMOS logic circuit are compared.

FIG. 5 shows a relationship between the operation frequency and power dissipation when the supplied voltage of the logic circuit is 1.5V in which the depletion mode CMOS logic circuit and the enhancement mode CMOS logic circuit are compared. Since power is dissipated in the steady state in the depletion mode CMOS logic circuit, the power dissipation is not decreased even if the operation frequency is lowered. In other words, it is significant to use the depletion mode CMOS logic circuit if power dissipation in the transient state exceeds power dissipation in the steady state. The CMOS logic circuit of the enhancement mode can be replaced with that of the depletion mode to operate in response to an input signal having a frequency incapable of operating the former CMOS logic circuit.

Figure 6:
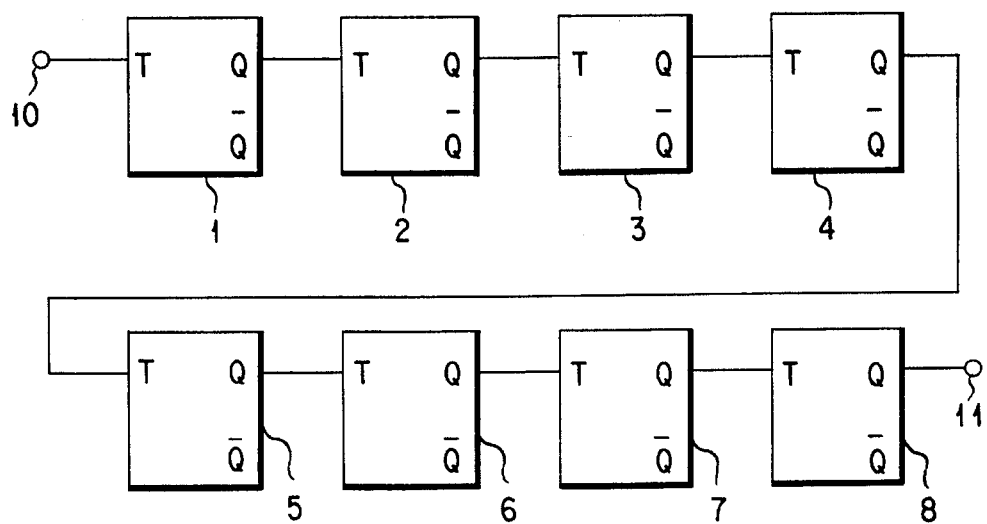
FIG. 6 is a circuit diagram of an eight-stage (1/256) frequency divider using a trigger flip-flop circuit.

FIG. 6 shows a circuit diagram of an eight-stage (1/256) frequency divider using a trigger flip-flop circuit according to the present invention. In FIG. 6, trigger flip-flop circuits 1–4 are composed by the depletion mode CMOS logic circuit, and trigger flip-flop circuits 5–8 are composed by the enhancement mode CMOS logic circuits.

The frequency divider receives high-frequency input from a terminal 10 and produces a 1/256 frequency output from a terminal 11. Whenever high-frequency power having the maximum operation frequency is input from the terminal 10, the first stage trigger flip-flop circuit 1 repeats a switching operation at the maximum speed.

The second stage trigger flip-flop circuit 2 is operated at half of the frequency of the input signal and the fourth stage trigger flip-flop circuit 4 is also operated at one sixteenth of the frequency of the input signal. In the fourth stage trigger flip-flop circuit 4, power dissipation in the transient state is still higher than that in the steady state. In the fifth stage trigger flip-flop circuit 5, the operation frequency is low enough to use the enhancement mode CMOS logic circuit. It is therefore effective to use the depletion mode CMOS logic circuit in the first to fourth stages of the 1/256 frequency divider and to use the enhancement mode CMOS logic circuit in the fifth to eighth stages of the 1/256 frequency divider.

To attain the same maximum operation frequency by the frequency divider formed only of the trigger flip-flop circuits of the enhancement mode CMOS logic circuit, as is apparent from FIG. 4, a supplied voltage of about 4V is required, and power dissipation in the switching operation at least seven times larger than the case of present invention.

If the frequency divider is formed of only trigger flip-flop circuits of the depletion mode CMOS logic circuit, the power dissipation in the steady state exceed the power dissipation in the transient state at the maximum operation frequency of enhancement mode CMOS logic circuit.

Figure 7:
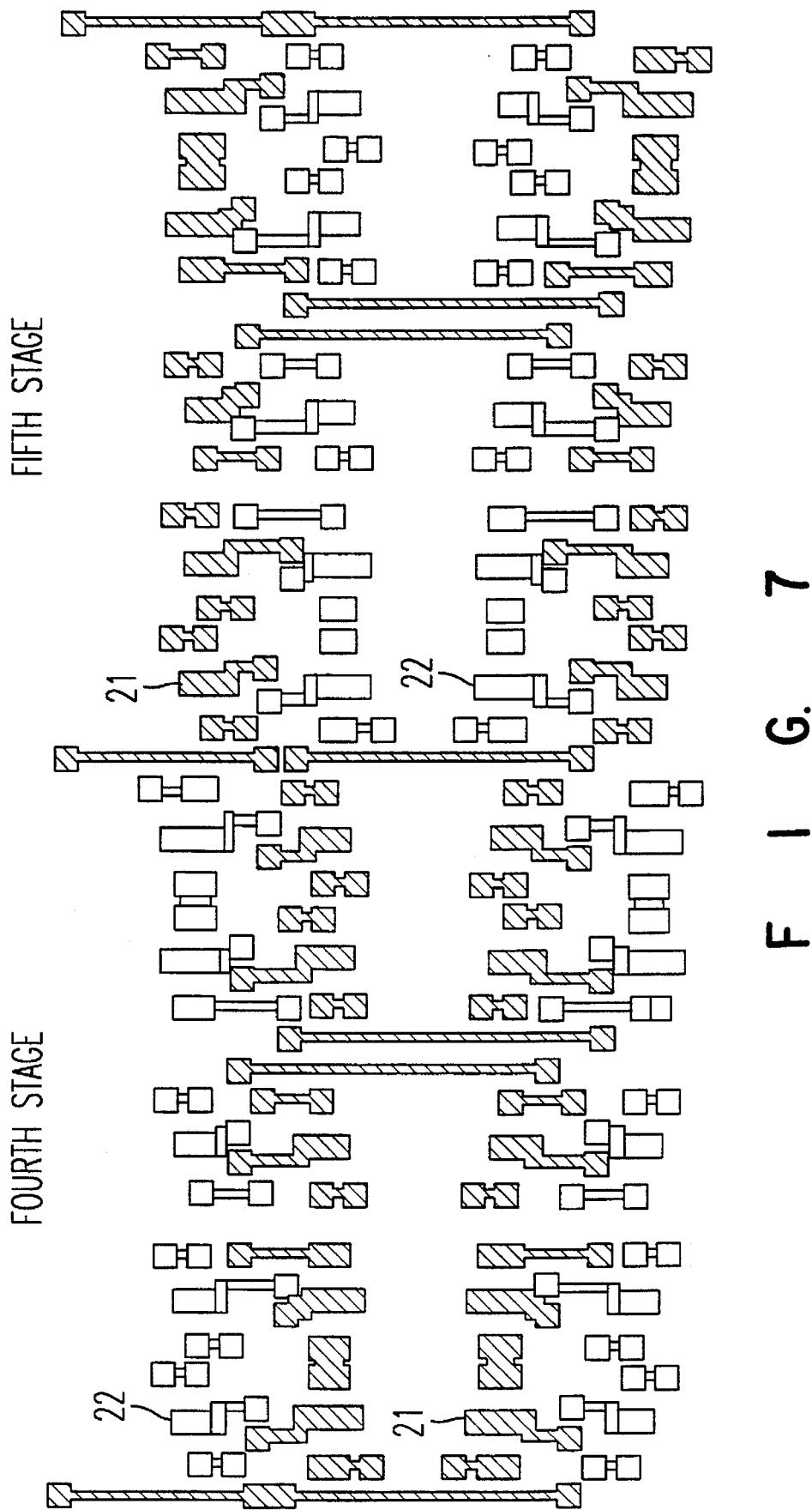
FIG. 7 is a view of mask patterns of polysilicon electrodes on the fourth and fifth stages of the eight-stage (1/256) frequency divider using a trigger flip-flop circuit in FIG. 1.

FIG. 7 shows mask patterns of polysilicon electrodes on the fourth and fifth stages of the 1/256 frequency divider of the present invention. In FIG. 7, black patterns 21 represent n-type polysilicon electrodes, and white patterns 22 represent p-type polysilicon electrodes. As is apparent from FIG. 7, in order to achieve the frequency divider of the present invention, the conductivity types of the gate electrode have only to be changed to each other between the fourth and fifth stages, and a new special manufacturing process need not be added.

As described above, the present invention provides a CMOS integrated circuit capable of high-speed and low power operation at low supplied voltage. The CMOS integrated circuit can be achieved without any special manufacturing process and it is industrially valuable.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A U-grooved insulated gate static induction integrated circuit comprising at least two CMOS logic circuits formed on a major surface of a semiconductor substrate, said at least two CMOS logic circuits including: an enhancement mode CMOS logic circuit including at least one pair of complementary U-grooved insulated gate static induction transistors in which threshold voltages are determined to cause current to slightly flow in the steady state; and a depletion mode CMOS logic circuit including at least one pair of complementary U-grooved insulated gate static induction transistors in which threshold voltages are determined to cause current to slightly flow in the steady state, said depletion mode CMOS logic circuit being used in a circuit in which an average power dissipation at a time of switching is higher than that of the steady state.

2. A U-grooved insulated gate static induction transistor integrated circuit formed on a major surface of a substrate, comprising:

an enhancement mode CMOS logic circuit including a complementary U-grooved insulated gate static induction transistor pair in which threshold voltages are determined to prevent current from flowing in a steady state; and a depletion mode CMOS logic circuit including a complementary U-grooved insulated gate static induction transistor pair in which threshold voltages are determined to cause current to slightly flow in the steady state, said depletion mode CMOS logic circuit being used in a circuit in which an operation frequency is higher than a maximum operation frequency of said enhancement mode CMOS logic circuit.

3. The integrated circuit according to either one of claims 1 or 2, wherein said enhancement mode CMOS logic circuit includes an n-channel U-grooved insulated gate static induction transistor having a polysilicon gate electrode of p-type high impurity concentration and a p-channel U-grooved insulated gate static induction transistor having a polysilicon gate electrode of n-type high impurity concentration, and said depletion mode CMOS logic circuit includes an n-channel U-grooved insulated gate static induction transistor having a polysilicon gate electrode of n-type high impurity concentration and a p-channel U-grooved insulated gate induction transistor having a polysilicon gate electrode of p-type high impurity concentration.

4. A U-grooved insulated gate static induction integrated circuit formed on a major surface of a substrate, comprising:

first to fourth stages trigger flip-flop circuits having depletion mode CMOS logic circuits including complementary U-grooved insulated gate static induction transistor pairs in which threshold voltages are determined to cause current to slightly flow in a steady state, fifth to eighth stages trigger flip-flop circuits having enhancement mode CMOS logic circuits including complementary U-grooved insulated gate static induction transistor pairs in which threshold voltages are determined to prevent current from flowing in the steady state; and said depletion mode CMOS logic circuits being used in a circuit in which an average power dissipation in a transient state is higher than that of the steady state.

5. A frequency divider comprising first to fourth stages trigger flip-flop circuits having depletion enhancement mode CMOS logic circuits and fifth to eight stages trigger flip-flop circuits having enhancement mode CMOS logic circuits;

wherein said enhancement mode CMOS logic circuits include an n-channel U-grooved insulated gate static induction transistor having a polysilicon gate electrode of p-type high impurity concentration and a p-channel U-grooved insulated gate static induction transistor having a polysilicon gate electrode of n-type high impurity concentration, and said depletion mode CMOS logic circuits include an n-channel U-grooved insulated gate static induction transistor having a polysilicon gate electrode of n-type high impurity concentration and a p-channel U-grooved insulated gate induction transistor having a polysilicon gate electrode of p-type high impurity concentration.

6. The frequency divider according to claim 4, wherein mask patterns of p-type gate electrodes of the first to fourth stages trigger flip-flop circuits are same as those of n-type gate electrodes of the fifth to eighth stages trigger flip-flop circuits and mask patterns of n-type gate electrodes of the first to fourth stages trigger flip-flop circuits are same as those of p-type gate electrodes of the fifth to eighth stages flip-flop circuits.

7. The frequency divider according to claim 5, wherein mask patterns of p-type gate electrodes of the first to fourth stages trigger flip-flop circuits are same as those of n-type gate electrodes of the fifth to eighth stages trigger flip-flop circuits and mask patterns of n-type gate electrodes of the first to fourth stages trigger flip-flop circuits are same as those of p-type gate electrodes of the fifth to eighth stages flip-flop circuits.

* * * * *